(12) United States Patent
Barsun (10) Patent No.: US 7,239,520 B2
(45) Date of Patent: Jul. 3, 2007

(54) SELF-LOCKING FASTENER ADAPTED TO SECURE A HEAT SINK TO A FRAME

(75) Inventor: Stephan Karl Barsun, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 281 days.

(21) Appl. No.: 11/026,367

(22) Filed: Dec. 29, 2004

(65) Prior Publication Data

US 2006/0139885 A1   Jun. 29, 2006

(51) Int. Cl.
*H05K 7/20* (2006.01)

(52) U.S. Cl. .................. 361/719; 361/704; 24/297; 24/453; 257/719; 248/509

(58) Field of Classification Search ............... None
See application file for complete search history.

(56) References Cited

U.S. PATENT DOCUMENTS

| | | | |
|---|---|---|---|
| 4,710,852 A | 12/1987 | Keen | |
| 5,464,054 A | 11/1995 | Hinshaw et al. | |
| 5,586,005 A * | 12/1996 | Cipolla et al. | 361/719 |
| 5,677,829 A | 10/1997 | Clemens | |
| 5,707,282 A | 1/1998 | Clements et al. | |
| 5,771,559 A | 6/1998 | Cipolla et al. | |
| 5,788,566 A | 8/1998 | McAnally et al. | |
| 5,886,871 A | 3/1999 | Jeffries et al. | |
| 5,999,402 A | 12/1999 | Jeffries et al. | |
| 6,084,178 A * | 7/2000 | Cromwell | 174/383 |
| 6,101,096 A * | 8/2000 | MacGregor et al. | 361/720 |
| 6,160,709 A | 12/2000 | Li | |
| 6,331,937 B1 * | 12/2001 | Bartyzel | 361/687 |
| 6,430,041 B1 | 8/2002 | Johnson et al. | |
| 6,430,049 B1 | 8/2002 | Lai et al. | |
| 6,473,305 B1 | 10/2002 | Gordon et al. | |
| 6,485,260 B2 | 11/2002 | Orlowski et al. | |
| 6,667,884 B1 | 12/2003 | Lee et al. | |
| 6,697,256 B1 * | 2/2004 | Horng et al. | 361/704 |
| 6,809,929 B2 * | 10/2004 | Liu | 361/704 |
| 6,858,796 B1 * | 2/2005 | Garnett et al. | 174/359 |
| 2004/0192101 A1 | 9/2004 | Arbogast | |
| 2004/0238947 A1 | 12/2004 | Rumer et al. | |
| 2004/0252461 A1 | 12/2004 | Wu | |

* cited by examiner

*Primary Examiner*—Boris Chérvinsky (57) ABSTRACT

An assembly comprises a frame configured to mount an electronic device and assemble to a heat sink. The assembly further comprises at least one self-locking fastener adapted to lock into place and secure the heat sink to the frame on aligned compression of the heat sink toward the framed.

27 Claims, 9 Drawing Sheets

SELF-LOCKING FASTENER ADAPTED TO SECURE A HEAT SINK TO A FRAME

BACKGROUND OF THE INVENTION

Economic and competitive conditions create incentive for business organizations to improve operations to reduce costs, including inventory costs. Operations can be improved in fields of advancing technology by focusing design and development resources in areas that improve competitive advantage while leveraging costs of other product aspects across multiple products.

Cost leveraging enables aggregation of component demand across possibly many products leading to improved economies of scale, aggregate volume discounts, and reduction of supplier prices. Component leveraging also can reduce supply chain, handling, and inventory costs since component sorting, labeling, and tracking are reduced.

Component leveraging can reduce costs in other areas. For example, usage of a particular component in multiple products can avoid duplication of research and development costs. A reduction in the number of components can reduce the incidence of confusion and errors by inadvertently including an incompatible component in a product.

In a high-volume producer, inventory handling and tracking costs can be reduced by millions of dollars simply by aggregating components among multiple products.

Products can be designed to facilitate materials handling of particular systems and/or assemblies.

SUMMARY

In accordance with an embodiment of an electronic apparatus, an assembly comprises a frame configured to mount an electronic device and assemble to a heat sink. The assembly further comprises at least one self-locking fastener adapted to lock into place and secure the heat sink to the frame on aligned compression of the heat sink toward the frame.

BRIEF DESCRIPTION OF THE DRAWINGS

Embodiments of the invention relating to both structure and method of operation, may best be understood by referring to the following description and accompanying drawings whereby.

DETAILED DESCRIPTION

A self-locking fastener is used to hold a heat sink onto an electronic device carrier, enabling the heat sink to be removed as part of the carrier while not requiring preassembly of the heat sink to the carrier.

In a particular embodiment, the self-locking fastener may be a barbed fastener for securing the heat sink to a processor carrier.

Figure 1:
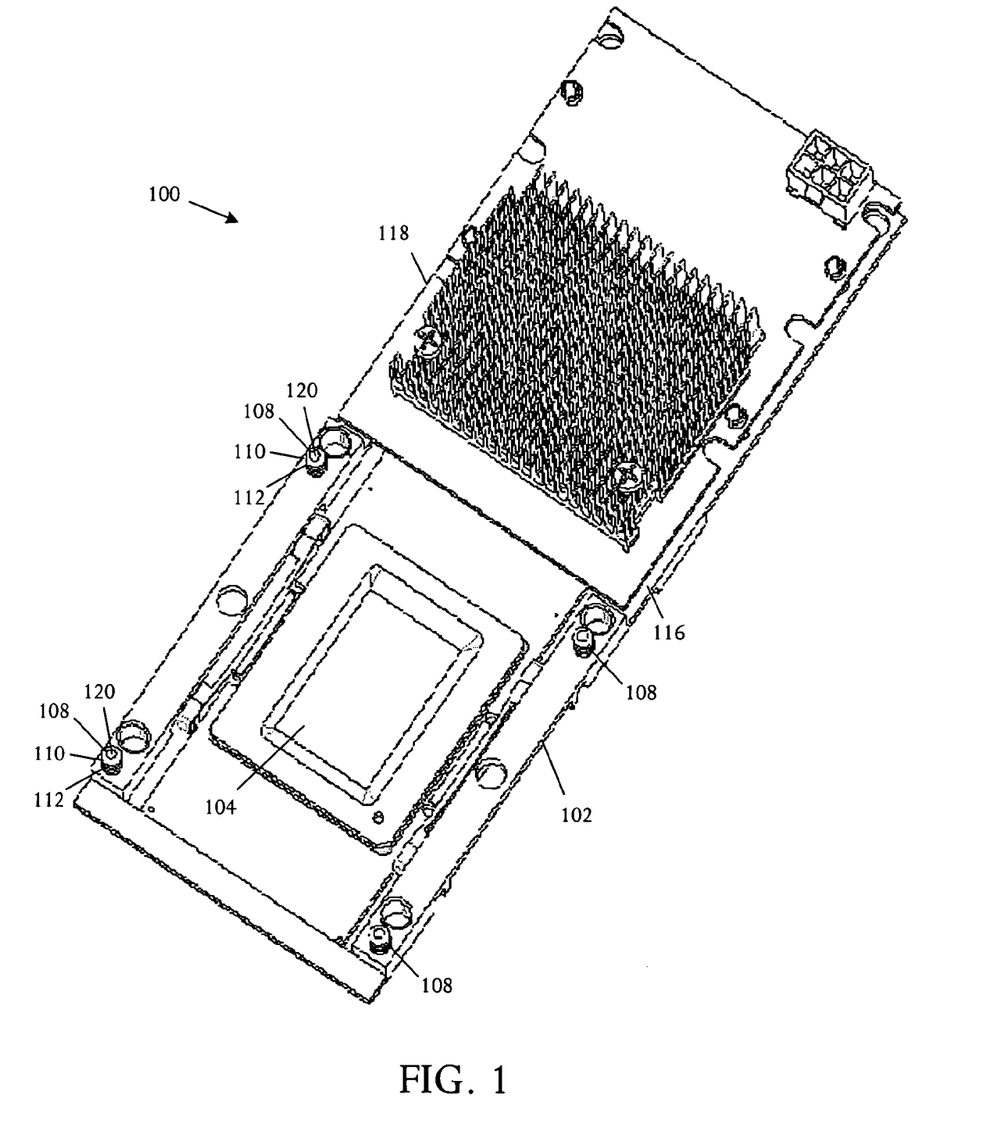
FIG. 1 is a perspective pictorial diagram illustrating an embodiment of an assembly adapted to secure a heat sink to a frame using a self-locking fastener.

Referring to FIG. 1, a perspective pictorial diagram illustrates an embodiment of an assembly 100 adapted to secure a heat sink to a frame 102 using a self-locking fastener 108. The assembly 100 comprises a frame 102 that is configured to mount an electronic device 104 and assemble to a heat sink. The assembly 100 further comprises at least one self-locking fastener 108 adapted to lock into place and secure the heat sink to the frame 102 on aligned compression of the heat sink toward the frame 102.

In an illustrative embodiment, a heat sink is generally configured to couple to the frame 102 and has multiple apertures in alignment with the self-locking fasteners 108. The self-locking fastener 108 further includes resilient barbs 110 with serrations 112 that compress upon entry into an aperture in the heat sink and expand on exit from the aperture to hold the heat sink in place. In the illustrative embodiment, the self-locking fastener 108 is a member 120 with serrated one-way barbs 110.

In some embodiments, the assembly 100 includes a common carrier 116 made up of the frame 102, a power pod 118 secured to the frame 102, and the electronic device 104 mounted to the frame 102. The electronic device 104, for example a processor, is secured to the frame 102 before attaching the heat sink to the frame 102.

The self-locking fasteners 108 with multiple one-way barbs 110 can be attached to the frame 102 to secure the heat sink. The barbs 110 are constructed to hold the heat sink to the frame 102 after the frame 102 is installed into a system, for example installed to a printed circuit board, and the heat sink can be added subsequently as a separate piece. As the heat sink is installed, apertures in the heat sink, which are aligned with the one or more self-locking fasteners 108, slide over the bards 110 and the serrations are first compressed and then expanded to hold the heat sink in place.

The barbs 110 may be formed and shaped using several techniques, including adding one or more cuts to a resilient member, enabling the member to expand and compress more easily.

The disclosed self-locking fasteners enable a relatively expensive common carrier that includes an electronic device such as a processor, a power pod, and the frame 102 to add the heat sink before or after the common carrier is installed in the system. The heat sink and associated thermal interface do not require re-installation every time the common carrier is reseated during manufacturing or in the field.

The self-locking fastener 108 enables and facilitates heat sink alignment during installation.

Referring to FIGS. 2A, 2B, 2C, 2D, and 2E, perspective pictorial diagrams illustrate embodiments of an assembly 200 comprising a field replaceable unit 202 adapted to mount an electronic device 204, for example a processor. The assembly 200 further comprises a heat sink 206 in a configuration that secures to the field replaceable unit 202 after mounting the electronic device 204. One or more self-locking fasteners 208 are configured to lock into place and secure the heat sink 206 to the field replaceable unit 202 on aligned compression of the heat sink 206 to the field replaceable unit 202.

Figure 2A:
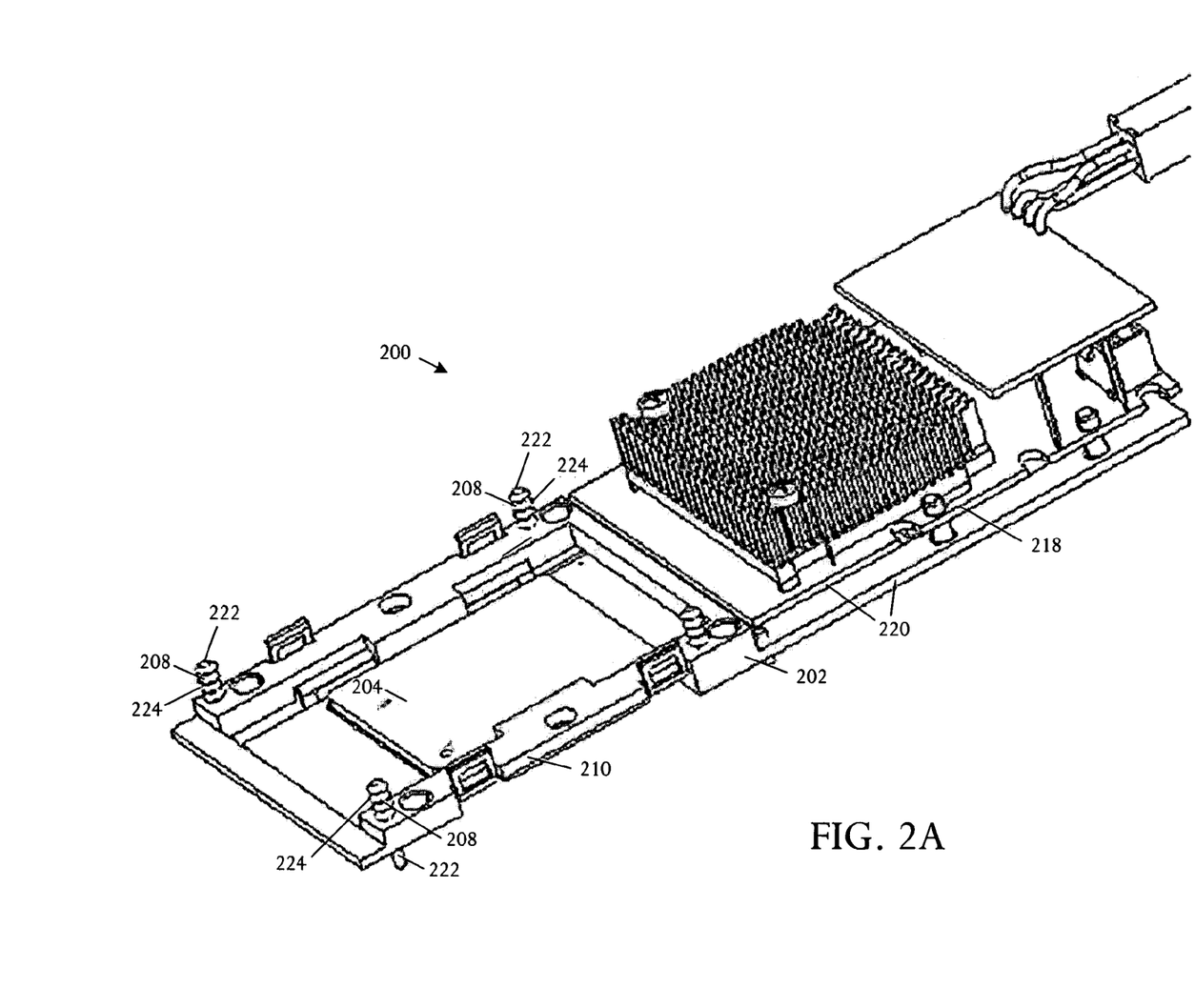
FIGS. 2A, 2B, 2C, 2D, and 2E are perspective pictorial diagrams depicting embodiments of an assembly including a field replaceable unit adapted to mount an electronic device and secure a heat sink using a self-locking fastener.
Figure 2B:
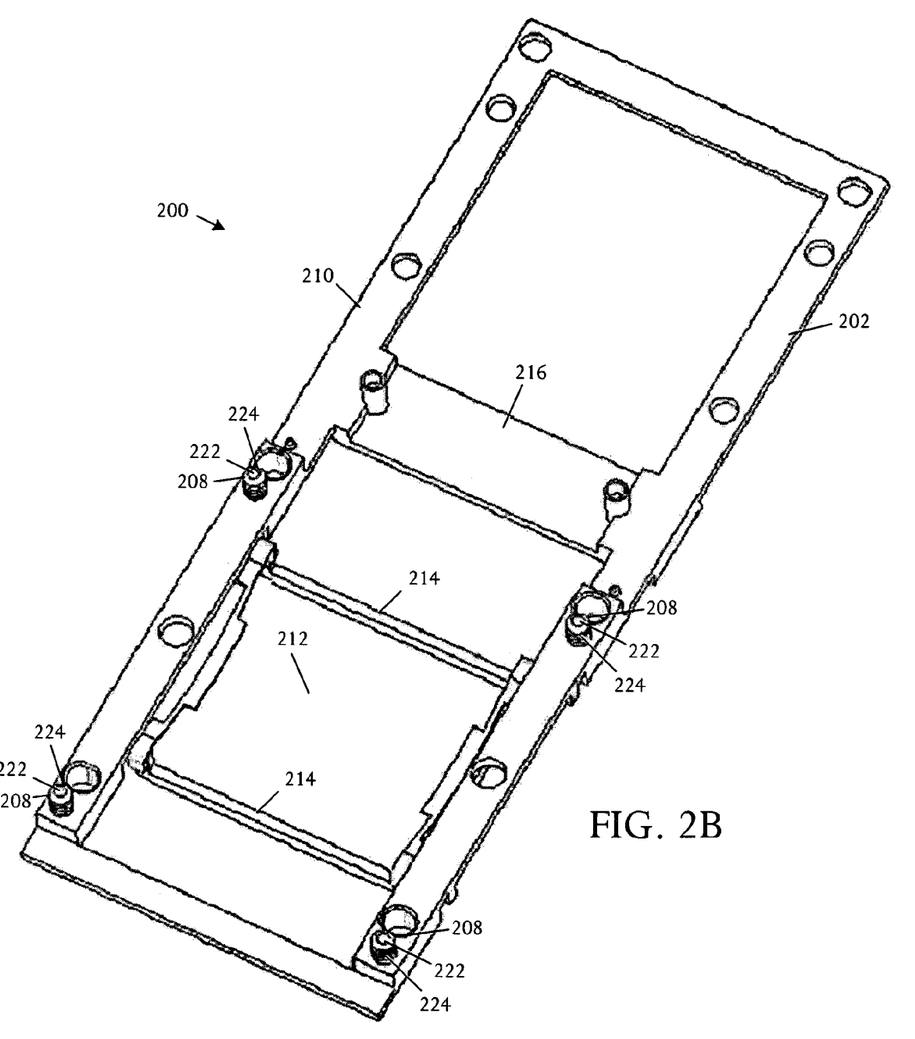
Figure 2C:
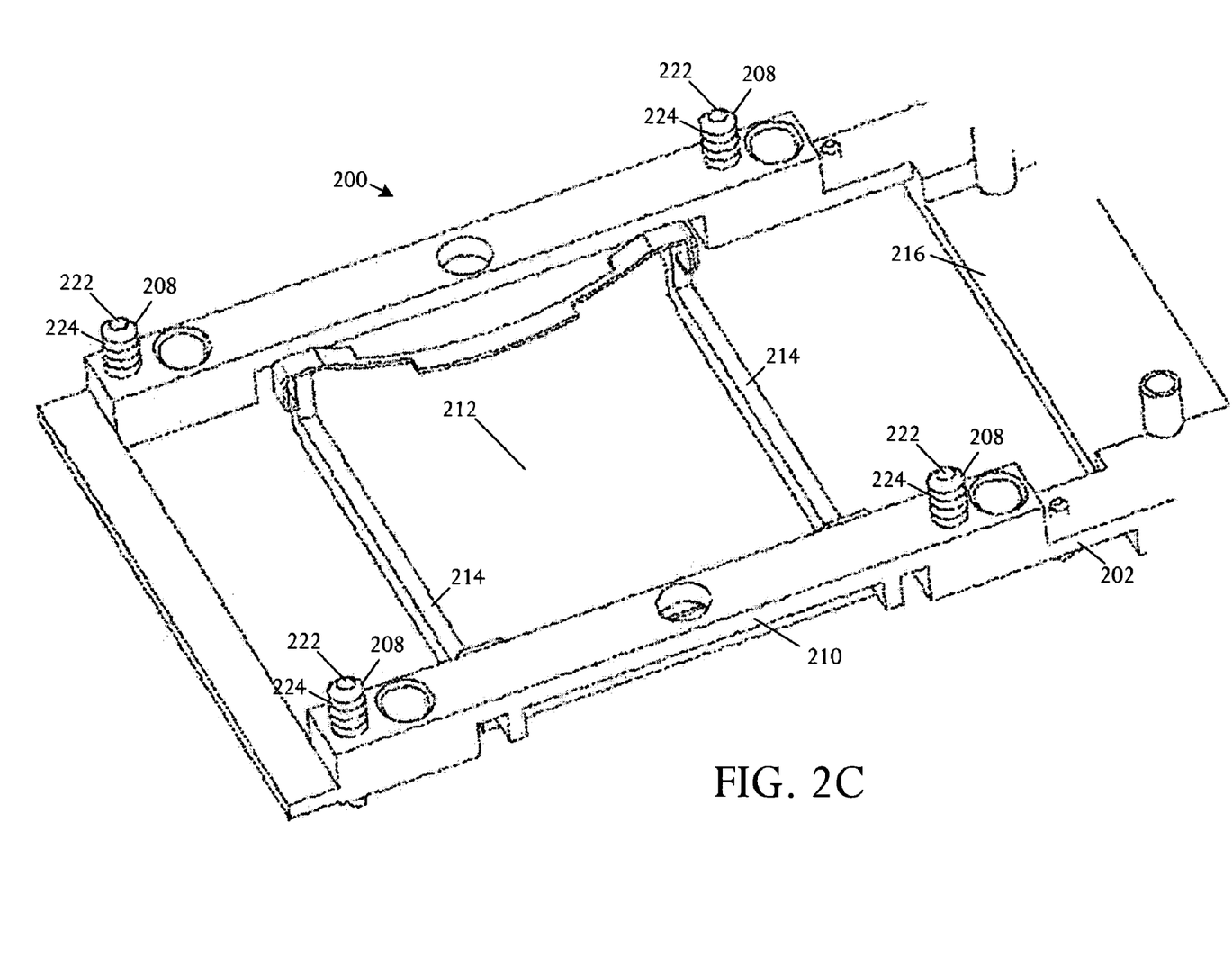
Figure 2D:
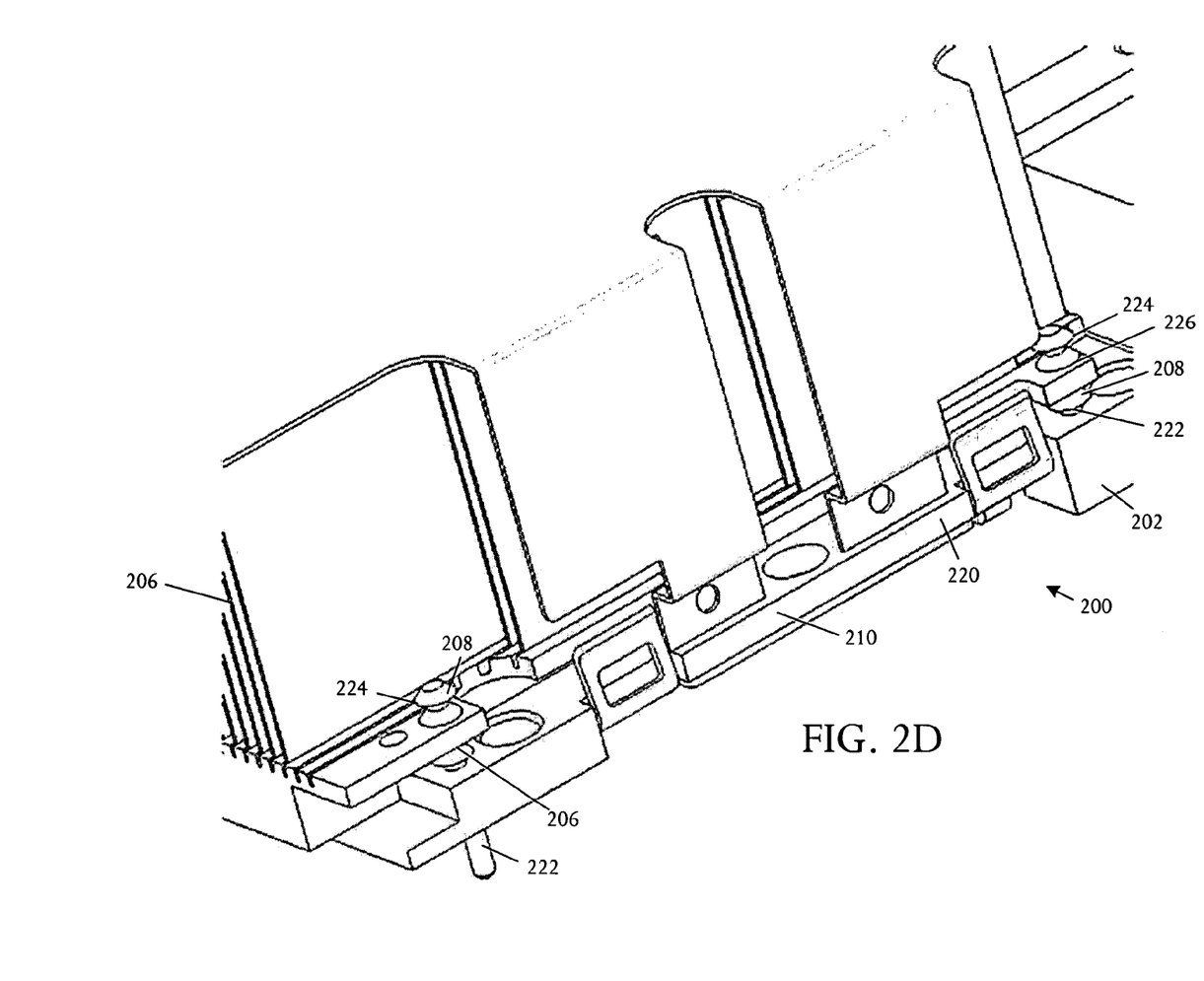

FIG. 2A shows the assembly 200 including the full common carrier 220 with power pod 218. FIG. 2B illustrates a subset of the assembly 200 including the frame 210 to facilitate viewing of the self-locking fasteners 208. FIG. 2C depicts the assembly subset with the fasteners 208 shown more closely. FIG. 2D illustrates the heat sink 206 mounted on the field replaceable unit 202.

In an illustrative embodiment, the field replaceable unit 202 further includes a frame 210, and a recess 212 formed on the frame 210 and adapted to receive the electronic device 204. One or more electronic device side supports 214 are coupled to the frame 210 adjacent the recess 212.

The field replaceable unit 202 may also include a bolster plate 216 integrated to the frame 210. The field replaceable unit 202, a power pod 218 connected to the field replaceable unit 202, and the electronic device 204, in combination, form a common carrier 220.

Integration of the bolster plate 216 into the frame 210 eliminates usage of a stand-alone bolster, thereby reducing cost and complexity, and increasing rigidity and durability. Frame supports coupling the frame to the bolster 216 can be constructed to reference the same side of the electronic device, for example the same side of a processor card, to facilitate electronic device connectivity despite possible variability in electronic device thickness.

In a particular example, the frame may form a mezzanine structure with an integrated bolster plate on the frame underside in a single integrated piece. A heat sink which is not part of the integral frame structure can be fastened to the integral frame after an electronic device such as a processor is secured to the frame.

In the depicted embodiment, the self-locking fasteners 208 are shown as a member 222 with serrated one-way barbs 224.

In the illustrative example embodiment, the heat sink 206 has multiple apertures 226 that are aligned with positioning of the multiple self-locking fasteners 208. Generally, the size and orientation of the apertures 226 are configured to suitably accept the self-locking fasteners 208. As shown, in a typical usage arrangement, the field replaceable unit 202 and heat sink 206 have generally planar surfaces that are arranged to match or mate and typically can extend in a horizontal plane, although any alignment may be implemented in a particular embodiment. On assembly of the heat sink 206 to the field replaceable unit 202, the heat sink 206 is moved towards the field replaceable unit 202 with the apertures 226 vertically aligned with the self-locking fasteners 208. Resilient barbs 224 on the self-locking fastener 208 are inserted and compress upon entry into the apertures 226. Serrations in the barbs 224 enable the compression. The self-locking fastener 208 is extended further through the aperture 226 and, upon exiting the aperture 226, the barbs 224 again expand to hold the heat sink 206 in place.

The field replaceable unit 202 is generally a hardware component which is capable of replacement in the field, rather than at the factory. The field replaceable unit may be replaced by a field engineer or other person, such as a customer or user. In various embodiments, the field replaceable unit 202 may be a hot-pluggable or hot-swappable assembly capable of replacement while power is connected to a system housing the assembly.

The field replaceable unit 202 is typically a mechanical assembly or circuit board capable of quick and simple removal and replacement by a user or technician without sending an entire system to a repair facility. A defective unit is generally discovered using common troubleshooting procedures, removed, and either shipped for repair or discarded with a replacement unit installed. Usage of the field replaceable unit 202 facilitates modular construction and may contribute to increased system availability and reliability.

During assembly of the electronic assembly 200, the field replaceable unit 202 is supplied that is adapted to mount an electronic device 204. The electronic device 204 is mounted to the field replaceable unit 202 and the heat sink 206 is guided onto the field replaceable unit 202 in alignment with the self-locking fastener 208. An assembler continues by compressing the heat sink 206 to the field replaceable unit 202 thereby locking into place and securing the heat sink 206.

In various embodiments and/or arrangements, the electronic assembly 200 may be adapted or configured so that the field replaceable unit 202 is first installed in an electronic system before attaching the heat sink 206. In some embodiments, the heat sink 206 may be attached to the field replaceable unit 202 before installing the assembly 200 into a system. Some arrangements enable the heat sink 206 to be assembled to the field replaceable unit 202 at any time, either before or after installation of the assembly 200 in a system.

The heat sink 206 is guided onto the field replaceable unit 202 in alignment over the resilient barbs 224 on the self-locking fasteners 208, first compressing serrations of the resilient barbs 224 upon entry into a heat sink aperture 226, then expanding the serrations as the resilient barbs 224 exit from the aperture 226, holding the heat sink 206 in place.

Characteristics and structure of the assembly 200 enable different platforms with different heat sinks to use a common carrier 220, thereby facilitating serviceability. For example, multiple field replaceable units 202 may be loaded with particular electronic devices, for example particular processors, and stocked. Inventory part numbers are assigned to the stocked field replaceable units 202 with the inventory part number being allocated based on item identification of field replaceable unit type and/or model and electronic device type and/or model. In a typical scenario, the common carrier 220 may accept several different processor types and models, typically with different operating speeds, processing capabilities, and power specifications. Processors are mounted and secured to the common carrier 220 and, according to processor model, assigned a part number. Loaded carriers with like processors may be assigned the same or similar inventor part numbers and stocked in common.

Similarly, multiple various heat sinks 206 or heat sink assemblies may be stocked and assigned inventory part numbers according to item identification of power assembly type and/or model, heat sink type and/or number, and other aspects, for example voltage regulator type and/or model.

The illustrative techniques and structures facilitate field service of a common carrier by holding the heat sink to the frame after first assembling the electronic device to the frame, eliminating a requirement that a user or service technician reapply a thermal interface after initial installation.

Figure 2E:
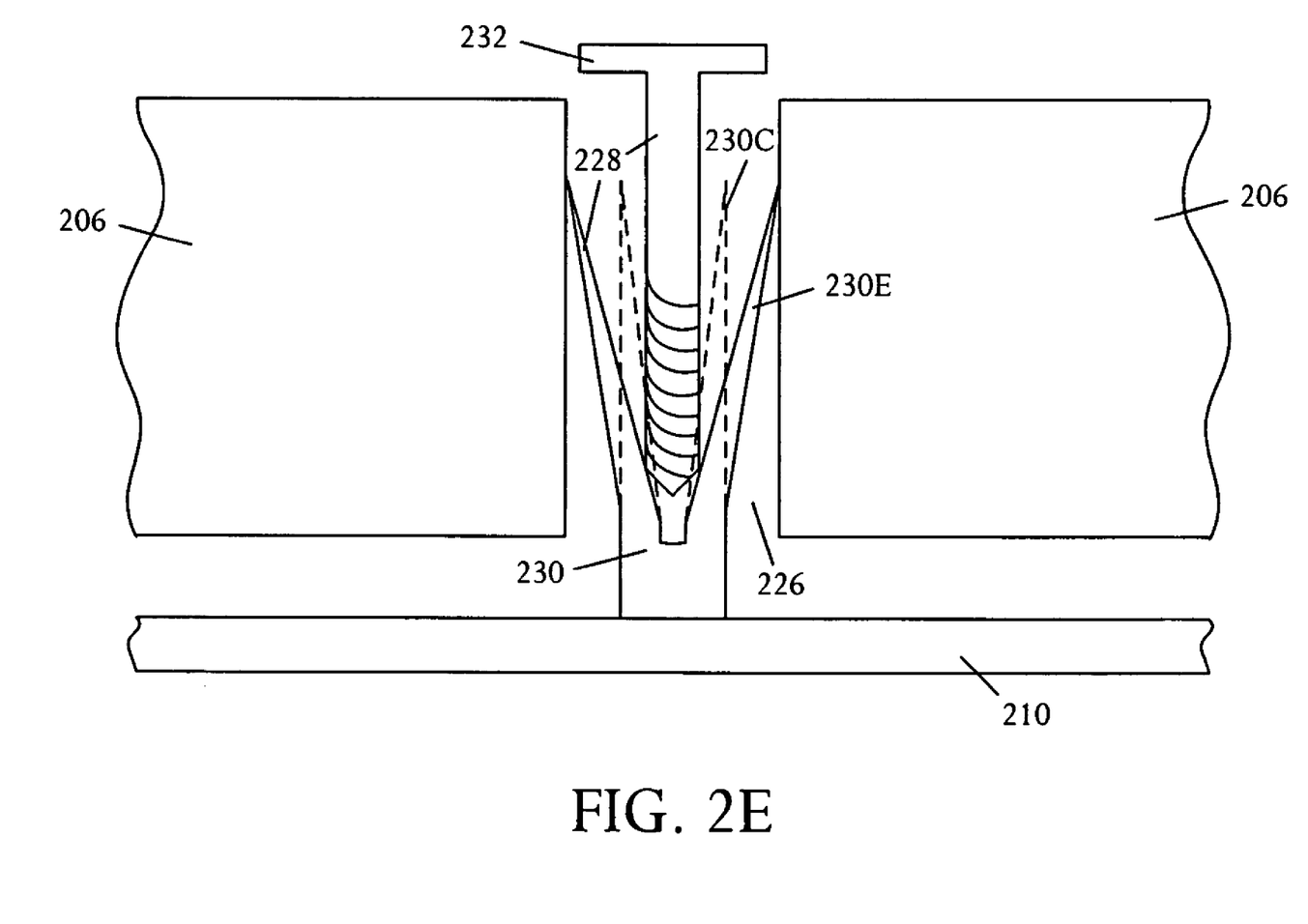

In some embodiments, the assembly 200 further includes retention hardware 228 that is configured to secure the heat sink 206 to the frame 210 of the field replaceable unit 202 using the one or more self-locking fasteners 208. FIG. 2E is a schematic pictorial diagram showing an embodiment of retention hardware 228 including at least one elastomer standoff member 230 coupled to the frame 210 and aligned for insertion into an aperture 226 in the heat sink 206. A fastener 232 is adapted for insertion through the aperture 226 in the heat sink 206, and engages and expands the respective standoff member 230. The standoff member 230 is generally manufactured in a contracted configuration 230C before receiving the fastener 232 for insertion. In various embodiments the fastener 232 may have any suitable structure or configuration for engaging and holding a structure. For example, the fastener 232 may be threaded or serrated. The fastener may be knurled or knotted, having various gnarled structures adapted to engage another structure. The fastener 232 is inserted, for example by rotating the fastener 232 with applied pressure so that the fastener 232 screws into the standoff member 230. In the expanded configuration 230E, the standoff members 230 engage sides of the apertures 226.

The retention hardware 228 supports a heat sink mass while concurrently enabling a suitable degree of tolerance perpendicular to the frame 210 and heat sink 206 plane. The illustrative retention hardware 228 includes the standoff member 230, for example in the form of elastomeric columns or pugs, which secures to the frame 210. In some embodiments the standoff member 230 is secured to a metal frame, a printed circuit board, a printed circuit board assembly mounting plate, or any other suitable structure. The fastener 232 locks the heat sink 206 in relation to the frame 210.

In a typical assembly process, the electronic device 204 is secured to the frame 210 in the common carrier 220. The heat sink 206 is connected to the common carrier 220 by pressing the heat sink 206 and common carrier 220 together with the self-locking fastener 208 and the standoff members 230 in mutual alignment with the heat sink apertures 226. The fasteners 232, for example screws, are tightened to generate a clamping force and set vertical height of the heat sink 206. The fasteners 232 engage mating threads in the standoff members 230, applying a compressive force internal to the standoff members 230, thereby expanding tines of the standoff members 230 and securing the standoff members 230 against a surface interior to the heat sink apertures 226. In some embodiments, the fasteners 232 may also be serrated push pins.

The retention hardware 228 may be used in various different configurations and in various circumstances and conditions for which a mass is to be secured that varies in position in relation to the surface to which the mass is attached. The retention hardware 228 enables the heat sink 206 to float to a position suitable with respect to tolerance while securing the heat sink 206 under shock and vibration.

In various other embodiments, retention hardware may include springs, hard mounts, wedge-lock hardware, and others.

Figure 3A:
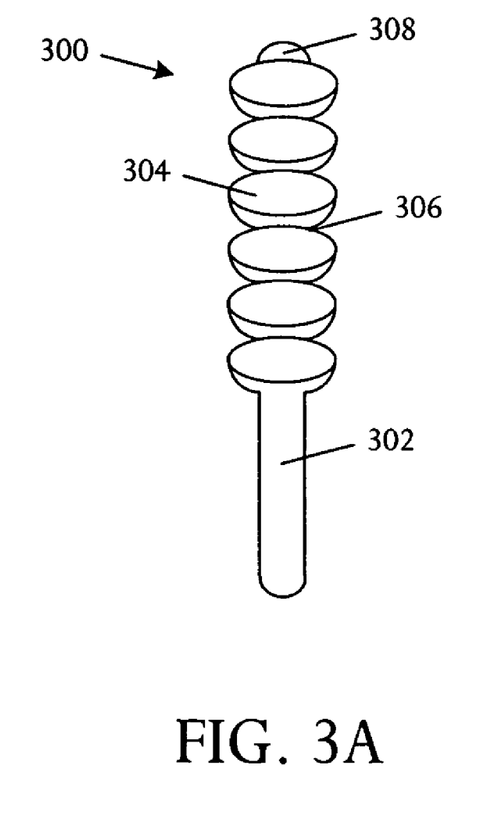
FIGS. 3A and 3B are schematic pictorial diagrams illustrating example embodiments of the self-locking fasteners.
Figure 3B:
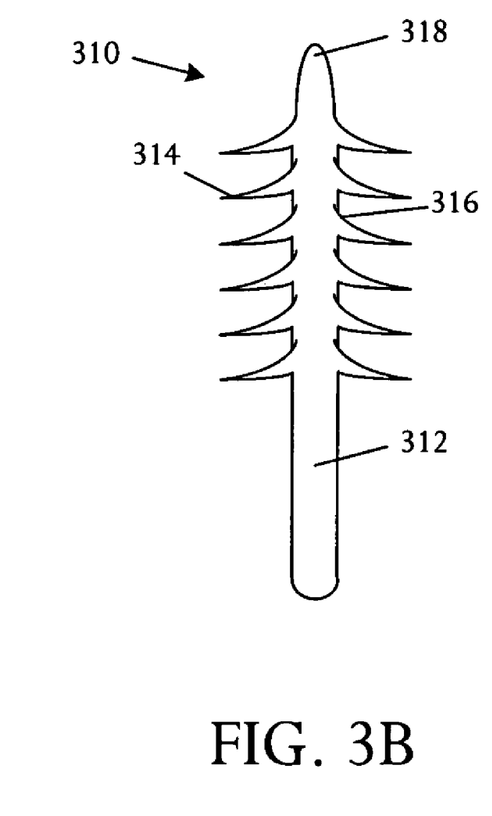

Referring to FIGS. 3A and 3B, two schematic pictorial diagrams illustrate example embodiments of the self-locking fasteners. In either case, the self-locking fasteners 300 and 310 have a shaft or member 302, 312 generally in the form of a straight post. Attached to the shaft 302, 312 are resilient barbs 304, 314 separated by serrations 306, 316. The self-locking fasteners 300, 310 may have a pointed end 308, 318 that facilitates alignment of the fastener into an aperture in the heat sink that is adapted to receive the fastener.

Figure 4A:
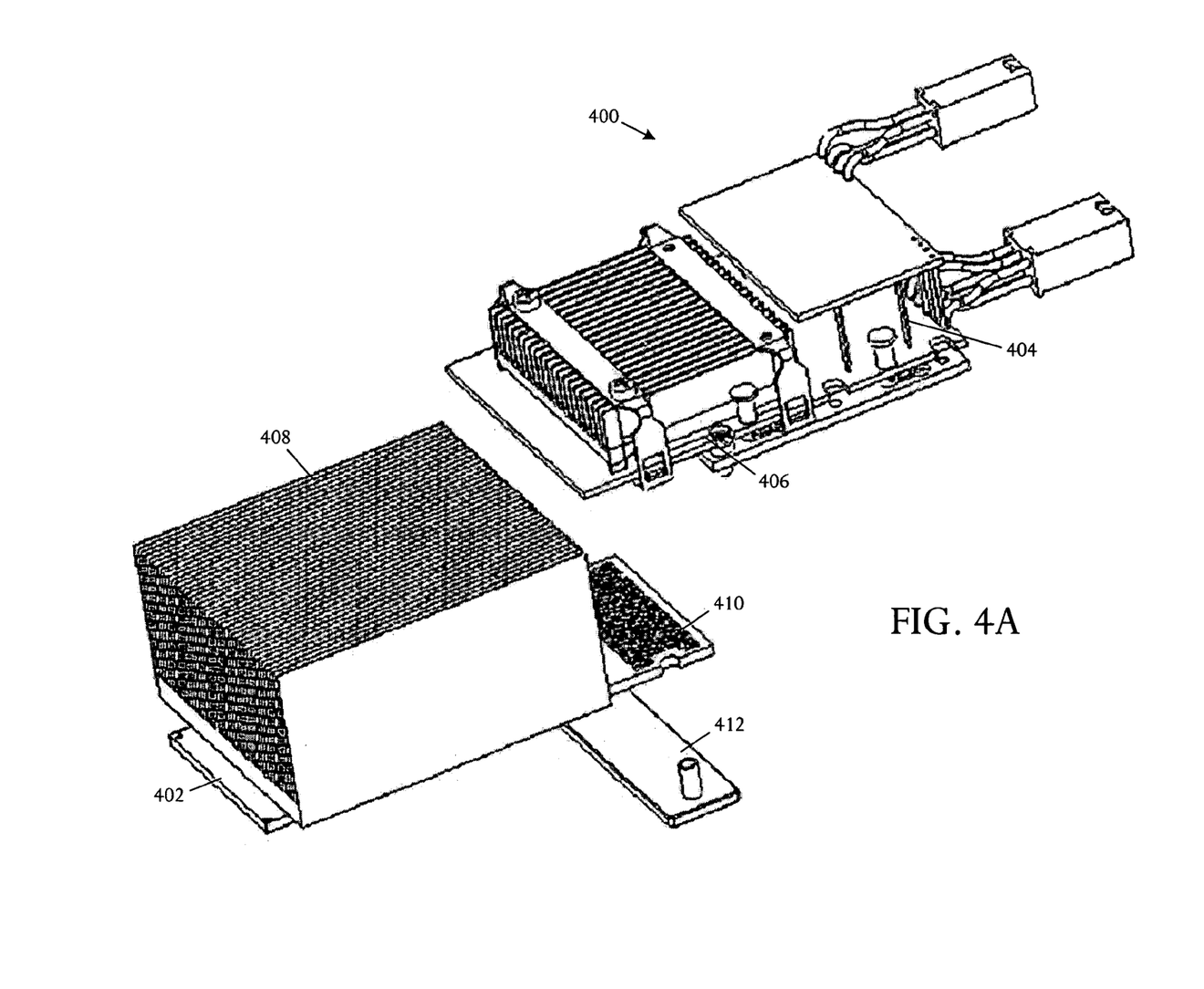
FIGS. 4A and 4B are perspective views showing examples of electronic assemblies and that assemble in a manner different from examples illustrated in FIGS. 1 through 3.
Figure 4B:
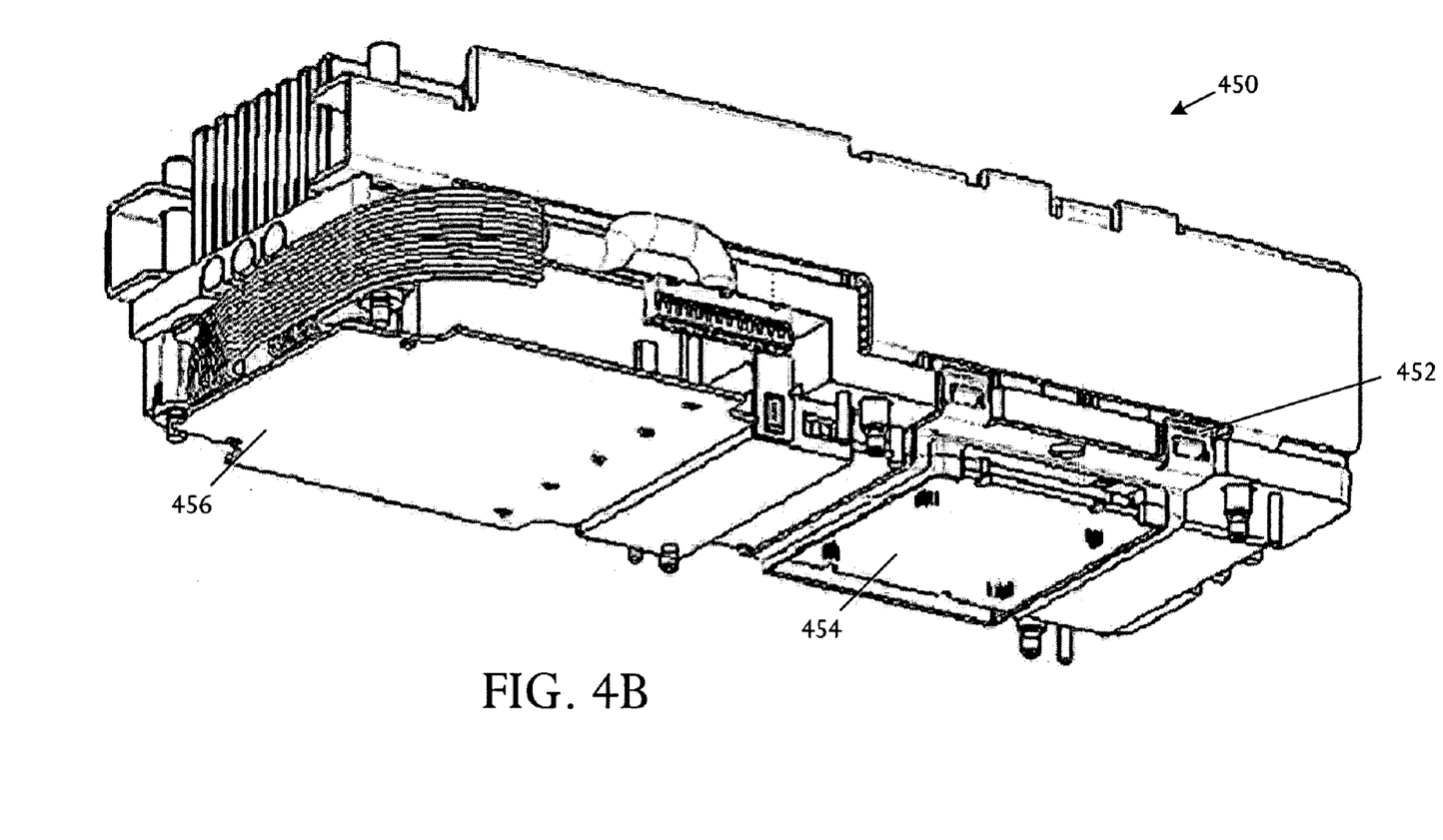

Referring to FIGS. 4A and 4B, two perspective views show examples of electronic assemblies 400 and 450 that assemble in a manner different from that illustrated in FIGS. 1 through 3. FIG. 4A shows an assembly 400 including a separated processor 402, power pod 404 with voltage regulator 406, and heat sink 408. The completely separated assembly 400 assembles inefficiently with multiple process steps. A further problem is that the connection between the power pod 404 or voltage regulator, and the processor 402 is difficult to make with separate pieces once the processor/heat sink is seated in a socket. A connection surface 410 between the voltage regulator 406 and processor 402 is fastened using a bolster plate 412.

FIG. 4B depicts an assembly 450 that is fastened using a clip 452 which holds a processor 454 to an integral assembly of combined components including a voltage regulator 456 and heat sink 458. The combined assembly 450 creates difficulty for multiple products to re-use the same field replaceable unit. Also, the combined structure 450 makes seating of the processor 454 difficult due to the unwieldy extra mass of the heat sink 458.

The common carrier approach for the combined assembly 450 avoids many difficulties of the separated assemblies 400, although if the processor 454 requires re-seating in the assembly during manufacturing or while in the field, a user or technician would have to reapply the thermal interface, a disorderly and difficult procedure to perform correctly and susceptible to contamination or poor thermal performance, thus poor reliability.

The assembly 450 includes the spring clip 452 which secures the processor 454 to the heat sink 458. In contrast, the assemblies shown in FIGS. 1 through 3 have the self-locking fastener that facilitates assembly of the heat sink to the carrier in an overall structure that avoids vibration and damage to the processor.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. For example, components, assemblies, devices, connectors, and springs with particular structures and geometries are shown. Other examples may have other suitable forms, structures, shapes, and geometries.

In the claims, unless otherwise indicated the article "a" is to refer to "one or more than one".

What is claimed is:

1. An assembly comprising:
   a frame configured to mount an electronic device and assemble to a heat sink;
   at least one self-locking fastener adapted to lock into place and secure the heat sink to the frame on aligned compression of the heat sink toward the frame; and
   at least one retention hardware distinct from the at least one self-locking fastener comprising:
     at least one clastomer standoff member coupled to the frame and aligned for insertion into an aperture in the heat sink; and
     at least one fastener adapted for insertion through the aperture in the heat sink, and engaging and expanding respective ones of the at least one standoff member whereby the expanded at least one standoff members engage sides of the apertures.

2. The assembly according to claim 1 further comprising:
   resilient barbs coupled to the at least one self-locking fastener and having serrations that compress upon entry into en aperture in the heat sink and expand on exit from the aperture to hold the heat sink in place.

3. The assembly according to claim 1 further comprising:
   a heat sink adapted to couple to the frame and having a plurality of apertures in alignment with the at least one self-locking fastener; and
   resilient barbs coupled to the at least one self-locking fastener and having serrations that compress upon entry into an aperture in the heat sink and expand on exit from the aperture to hold the heat sink in place.

4. The assembly according to claim 1 further comprising:
   the electronic device adapted to be secured to the frame before the heat sink is coupled to the frame.

5. The assembly according to claim 1 further comprising:
a common carrier comprising the frame, a power pod coupled to the frame, and the electronic device secured to the frame.

6. The assembly according to claim 1 wherein the at least one fastener is selected from among a group consisting of threaded fasteners, serrated fasteners, and knurled fasteners.

7. The assembly according to claim 1 wherein:
the electronic device is a processor configured to mount to the frame.

8. The assembly according to claim 1 wherein:
the at least one self-locking fastener is a member with serrated one-way barbs.

9. The assembly according to claim 1 wherein:
the heat sink is configured to assemble to the frame after the frame is installed in an electronic system.

10. The assembly according to claim 1 wherein:
the heat sink is configured to assemble to the frame before the frame is installed in an electronic system.

11. The assembly according to claim 1 further comprising:
the at least one retention hardware configured to support mass of the heat sink mass and enable tolerance between the frame and heat sink.

12. The assembly according to claim 1 further comprising:
the at least one retention hardware configured to secure the heat sink in a position that is variable in relation to the frame and enable mass of the heat sink to float relative to the frame under conditions of shock and vibration.

13. An assembly comprising:
a field replaceable unit adapted to mount an electronic device;
a heat sink in a configuration that secures to the field replaceable unit after mounting of the electronic device; and
at least one self-locking fastener adapted to lock into place and secure the heat sink to the field replaceable unit on aligned compression of the heat sink toward the field replaceable unit; and
at least one retention hardware distinct from the at least one self-locking fastener comprising:
at least one elastomer standoff member coupled to the field replaceable unit and aligned for insertion into an aperture in the heat sink; and
at least one fastener adapted for insertion through the aperture in the heat sink, and engaging and expanding respective ones of the at least one standoff member whereby the expanded at least one standoff members engage sides of the apertures.

14. The assembly according to claim 13 wherein the field replaceable unit further comprises:
a frame;
a recess formed on the frame and adapted to receive the electronic device; and
at least one electronic device side support coupled to the frame adjacent the recess.

15. The assembly according to claim 14 further comprising:
a bolster plate integrated to the frame.

16. The assembly according to claim 13 further comprising:
a heat sink adapted to couple to the field replaceable unit and having a plurality of apertures in alignment with the at least one self-locking fastener; and
resilient barbs coupled to the at least one self-locking fastener and having serrations that compress upon entry into an aperture in the heat sink and expand on exit from the aperture to hold the heat sink in place.

17. The assembly according to claim 13 further comprising:
a common carrier comprising the field replaceable unit, a power pod coupled to the field replaceable unit, and the electronic device secured to the field replaceable unit.

18. The assembly according to claim 13 further comprising:
the at least one retention hardware configured to support mass of the heat sink mass and enable tolerance between the frame and heat sink.

19. The assembly according to claim 13 wherein the at least one fastener is selected from among a group consisting of threaded fasteners, serrated fasteners, and knurled fasteners.

20. The assembly according to claim 13 wherein:
the electronic device is a processor configured to mount to the field replaceable unit; and
the at least one self-locking fastener is a member with serrated one-way barbs.

21. The assembly according to claim 13 wherein:
the heat sink is configured to assemble to the frame after the frame is installed in an electronic system.

22. The assembly according to claim 13 wherein:
the heat sink is configured to assemble to the frame before the frame is installed in an electronic system.

23. The assembly according to claim 13 further comprising:
the at least one retention hardware configured to secure the heat sink in a position that is variable in relation to the frame and enable mass of the heat sink to float relative to the frame under conditions of shock and vibration.

24. A method of constructing an electronic assembly comprising:
providing a field replaceable unit adapted to mount an electronic device;
mounting the electronic device to the field replaceable unit;
guiding a heat sink onto the field replaceable unit in alignment over at least one self-locking fastener;
compressing the heat sink to the field replaceable unit thereby locking into place and securing the heat sink to the field replaceable unit; and
securing the hcas sink to the frame with retention hardware distinct from the self-lacking fastener.

25. The method according to claim 24 further comprising:
guiding the heat sink onto the field replaceable unit in alignment over resilient barbs coupled to the at least one self-locking fastener;
compressing serrations of the resilient barbs upon entry into an aperture in the heat sink; and
expanding serrations of the resilient bards on exit from the aperture to hold the heat sink in place.

26. The method according to claim 24 further comprising:
supporting mass of the heat sink mass using the at least one retention hardware to enable tolerance between the frame and heat sink.

27. The method according to claim 24 further comprising:
securing the heat sink in a position that is variable in relation to the frame using the at least one retention hardware to enable mass of the heat sink to float relative to the frame under conditions of shock and vibration.

* * * * *

UNITED STATES PATENT AND TRADEMARK OFFICE
CERTIFICATE OF CORRECTION

PATENT NO. : 7,239,520 B2
APPLICATION NO. : 11/026367
DATED : July 3, 2007
INVENTOR(S) : Stephan Karl Barsun It is certified that error appears in the above-identified patent and that said Letters Patent is hereby corrected as shown below:

In column 2, line 37, delete "bards" and insert -- barbs --, therefor.

In column 6, line 44, in Claim 1, delete "clastomer" and insert -- elastomer --, therefor.

In column 6, line 55, in Claim 2, after "into" delete "en" and insert -- an --, therefor.

In column 7, line 35, in Claim 13, after "device;" delete "and".

In column 8, line 45, in Claim 24, delete "hcas" and insert -- heat --, therefor.

In column 8, line 46, in Claim 24, delete "self-lacking" and insert -- self-locking --, therefor.

In column 8, line 52, in Claim 25, delete "bards" and insert -- barbs --, therefor.

Signed and Sealed this

Twelfth Day of August, 2008

JON W. DUDAS
*Director of the United States Patent and Trademark Office*